(12) United States Patent
Mizuhara et al.

(10) Patent No.: US 10,964,508 B2
(45) Date of Patent: Mar. 30, 2021

(54) CHARGED-PARTICLE BEAM DEVICE

(71) Applicant: Hitachi High-Tech Corporation, Tokyo (JP)

(72) Inventors: Yuzuru Mizuhara, Tokyo (JP); Kouichi Kurosawa, Tokyo (JP)

(73) Assignee: Hitachi High-Tech Corporation, Tokyo (JP)

(*) Notice: Subject to any disclaimer, the term of this patent is extended or adjusted under 35 U.S.C. 154(b) by 0 days.

(21) Appl. No.: 16/620,065

(22) PCT Filed: Jul. 28, 2017

(86) PCT No.: PCT/JP2017/027413
§ 371 (c)(1),
(2) Date: Dec. 6, 2019

(87) PCT Pub. No.: WO2019/021454
PCT Pub. Date: Jan. 31, 2019

(65) Prior Publication Data
US 2020/0258713 A1 Aug. 13, 2020

(51) Int. Cl.
*H01J 37/05* (2006.01)
*H01J 37/244* (2006.01)

(52) U.S. Cl.
CPC ............ *H01J 37/05* (2013.01); *H01J 37/244* (2013.01); *H01J 2237/057* (2013.01)

(58) Field of Classification Search
CPC .... H01J 37/05; H01J 37/244; H01J 2237/057; H01J 2237/1508; H01J 2237/15;
(Continued)

(56) References Cited

U.S. PATENT DOCUMENTS 8,946,649 B2   2/2015 Sasaki et al.
10,229,811 B2* 3/2019 Mizuhara .............. H01J 37/147
(Continued)

FOREIGN PATENT DOCUMENTS

JP   61-156627 A   7/1986
JP   2014-146526 A  8/2014
(Continued)

OTHER PUBLICATIONS

International Search Report (PCT/ISA/210) issued in PCT Application No. PCT/JP2017/027413 dated Oct. 24, 2017 with English translation (three pages).
(Continued)

*Primary Examiner* — Michael Maskell
(74) *Attorney, Agent, or Firm* — Crowell & Moring LLP

(57) ABSTRACT

The purpose of the present invention is to provide a charged-particle beam device capable of stable performance of processes such as a measurement or test, independent of fluctuations in sample electric electric potential or the like. To this end, this charged-particle beam device comprises an energy filter for filtering the energy of charged particles released from the sample and a deflector for deflecting the charged particles released from the sample toward the energy filter. A control device generates a first image on the basis of the output of a detector, adjusts the voltage applied to the energy filter so that the first image reaches a prescribed state, and calculates deflection conditions for the deflector on the basis of the post-adjustment voltage applied to the energy filter.

15 Claims, 9 Drawing Sheets

(58) Field of Classification Search
CPC ......... H01J 2237/22; H01J 2237/24485; H01J 2237/004; H01J 2237/2814; H01J 2237/28
USPC ............................... 250/306, 307, 310, 311
See application file for complete search history.

(56) References Cited

U.S. PATENT DOCUMENTS

| | | | |
|---|---|---|---|
| 2007/0090288 A1* | 4/2007 | Shemesh | H01J 37/28 250/305 |
| 2014/0124666 A1* | 5/2014 | Sasaki | H01J 37/26 250/310 |
| 2017/0186583 A1 | 6/2017 | Shirahata et al. | |
| 2018/0286629 A1 | 10/2018 | Sakakibara et al. | |

FOREIGN PATENT DOCUMENTS

| | | |
|---|---|---|
| JP | 5663412 B2 | 2/2015 |
| WO | WO 2012/172720 A1 | 12/2012 |
| WO | WO 2015/163266 A1 | 10/2015 |
| WO | WO 2016/084675 A1 | 6/2016 |

OTHER PUBLICATIONS

Japanese-language Written Opinion (PCT/ISA/237) issued in PCT Application No. PCT/JP2017/027413 dated Oct. 24, 2017 (four pages).

* cited by examiner

[FIG. 1]
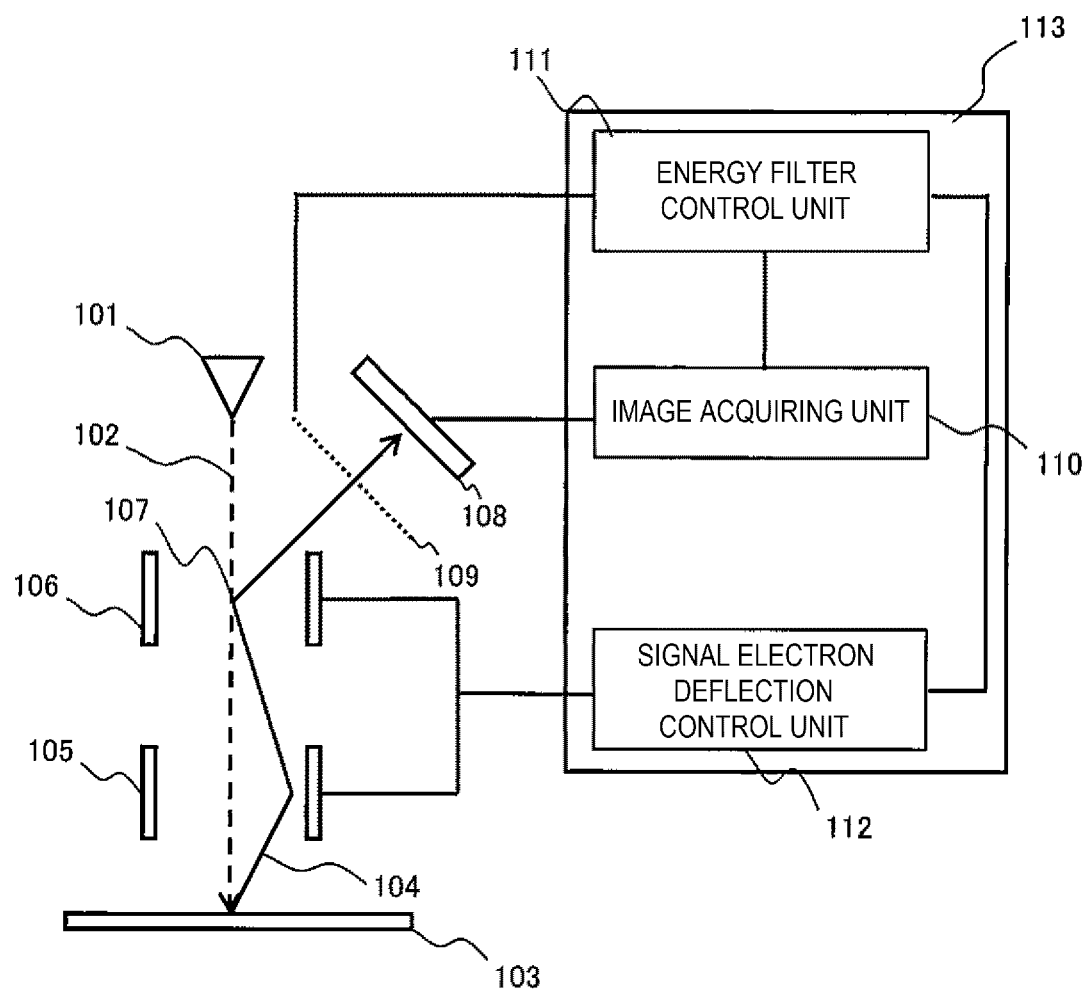

[FIG. 2]
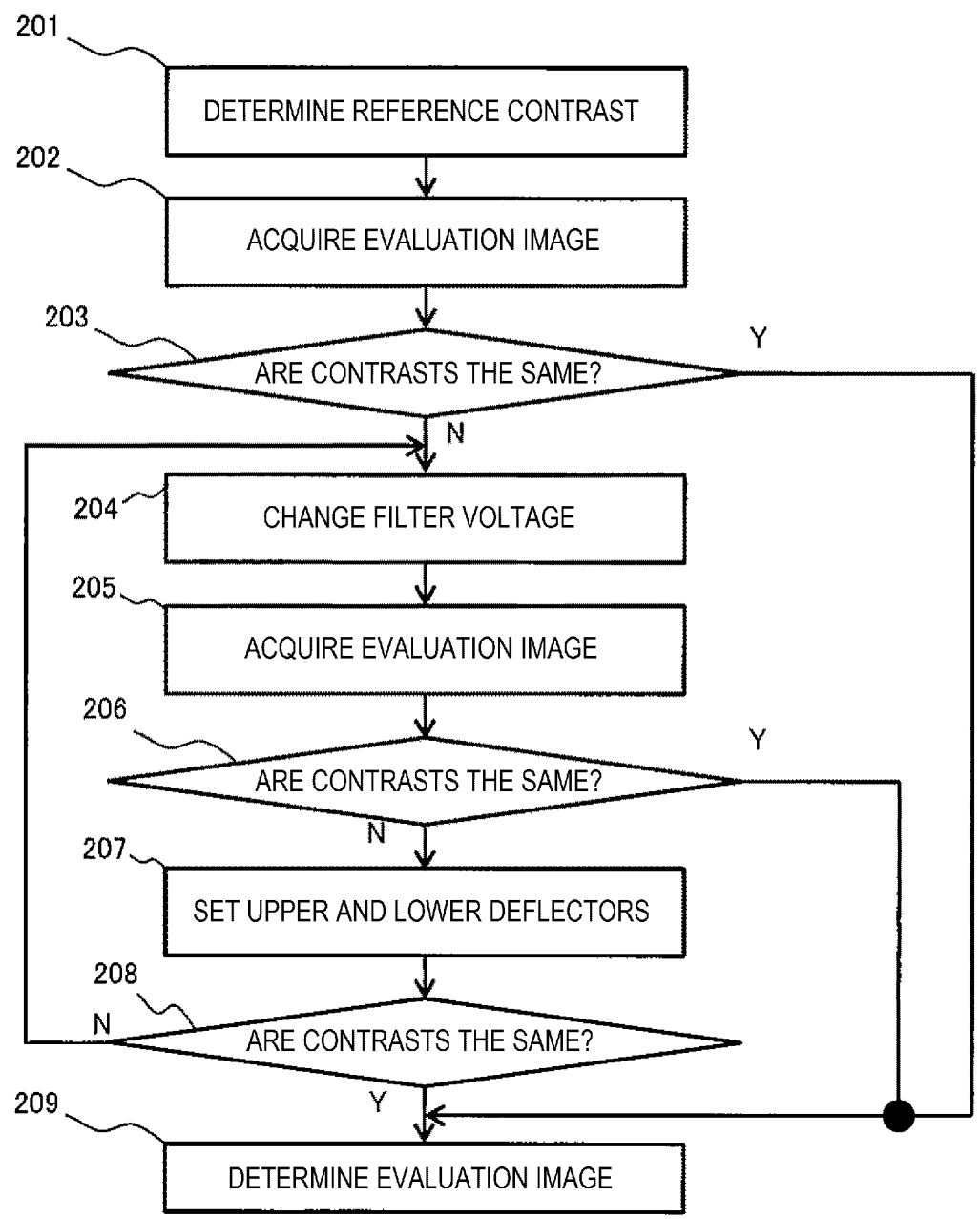

[FIG. 4]
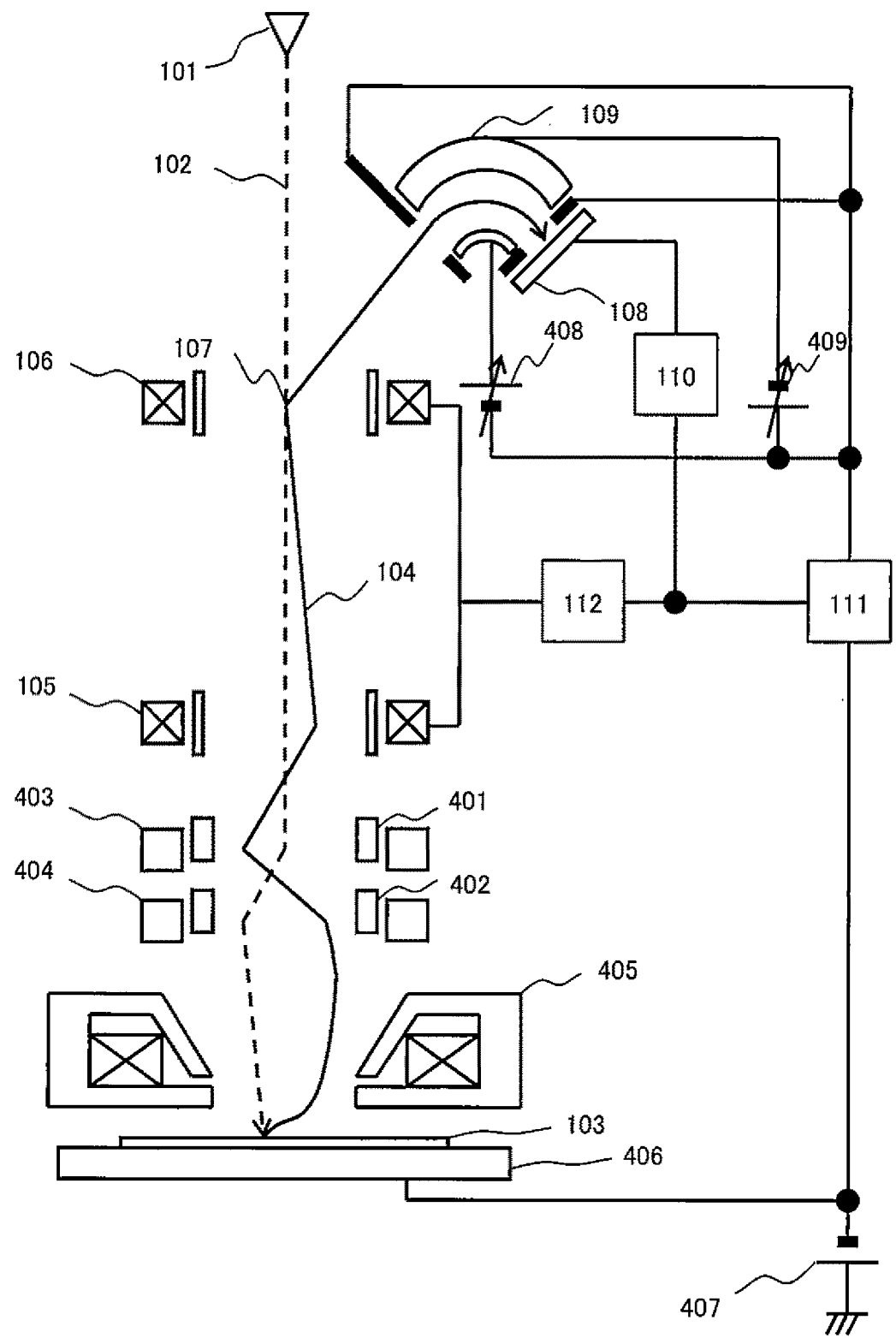

[FIG. 5]
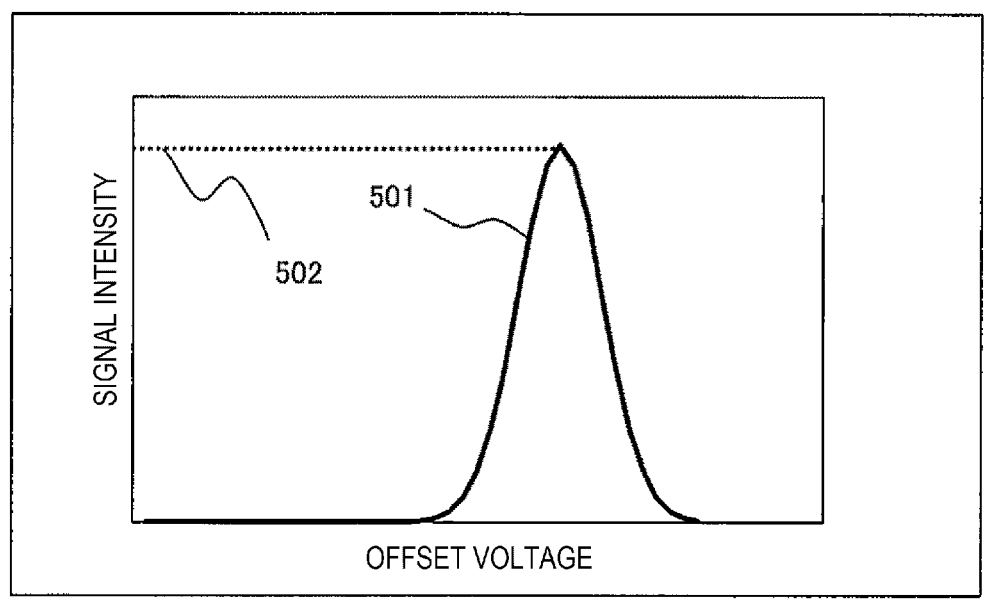

[FIG. 6]
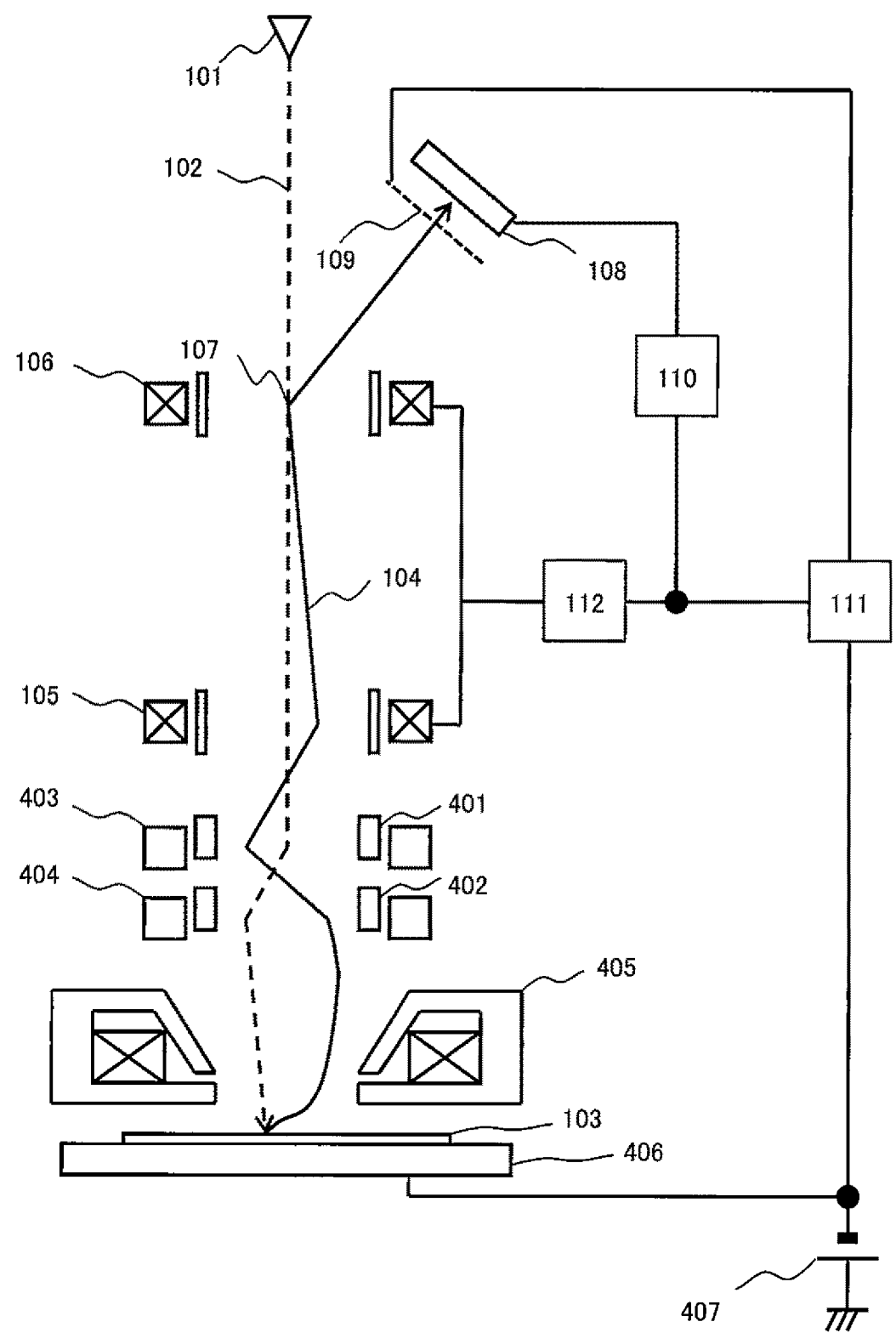

[FIG. 7]
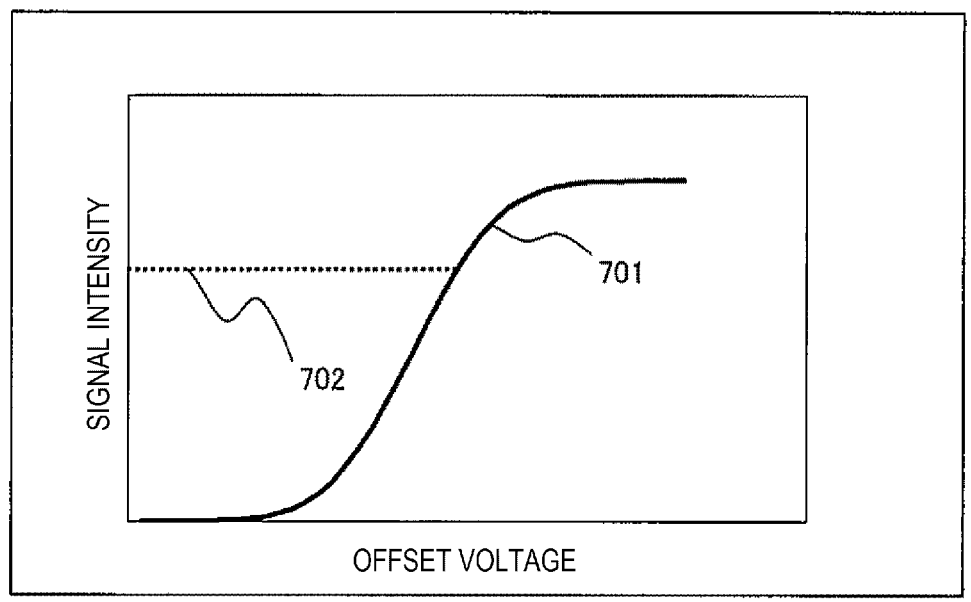

[FIG. 8]
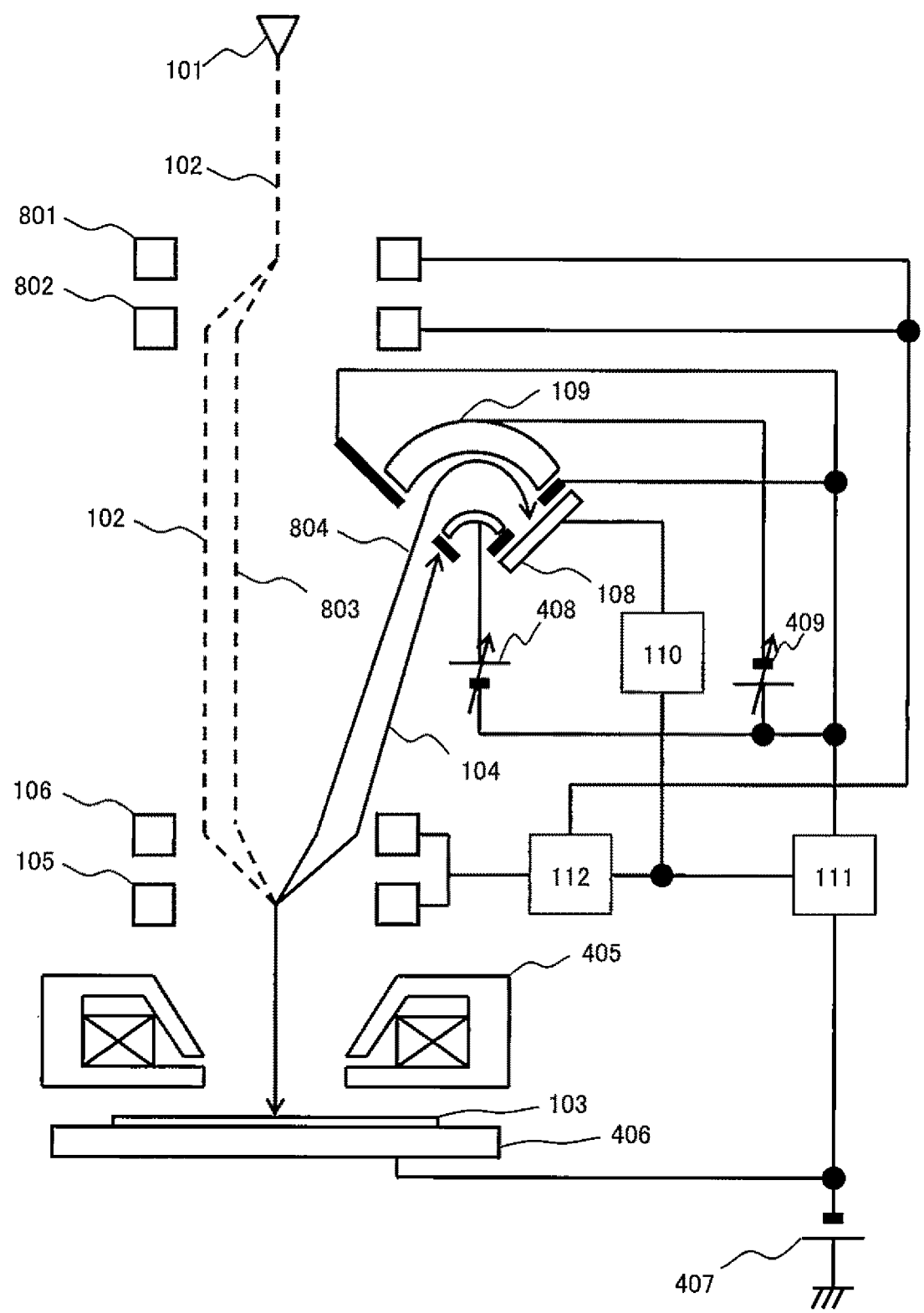

[FIG. 9]
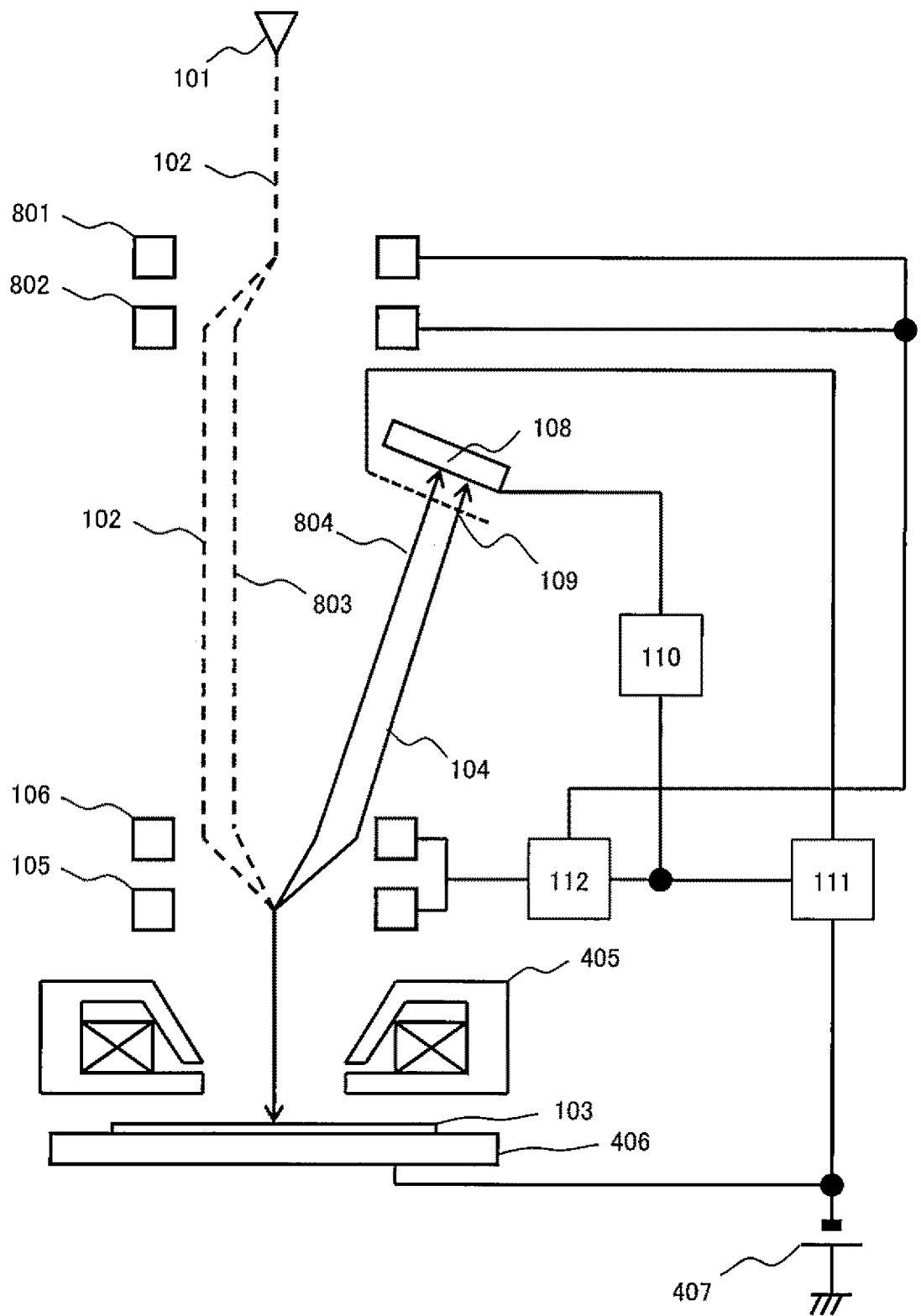

CHARGED-PARTICLE BEAM DEVICE

TECHNICAL FIELD

The present disclosure relates to a charged-particle beam device, and particularly to a charged-particle beam device that controls a trajectory of signal charged particles emitted from a sample.

BACKGROUND ART

A charged-particle beam device such as a scanning electron microscope generates an image or a signal waveform based on detection of charged particles (secondary electrons or backscattered electrons) obtained by irradiating a sample with a charged-particle beam. Such a charged-particle beam device includes an energy filter or a spectrometer used for selectively detecting charged particles having specific energy emitted from the sample.

PTL 1 discloses a scanning electron microscope in which a deflection condition of a secondary electron deflector is set so that the number of secondary electrons entering a spectrometer is maximized. PTL 2 discloses a charged-particle beam device that compensates for an electric potential fluctuation of a sample by adjusting a voltage applied to an energy filter. PTL 3 discloses a charged-particle beam device that adjusts a trajectory of electrons entering an energy filter so that a luminance difference between specific portions is maximized.

PRIOR ART LITERATURE

Patent Literature

PTL 1: WO2015/163266 (corresponding US Patent Publication No. US2017/0186583)
PTL 2: WO2016/084675
PTL 3: Japanese Patent No. 5663412 (corresponding U.S. Pat. No. 8,946,649)

SUMMARY OF INVENTION

Technical Problem

In order to improve a contrast of an observation unit when observation is performed by a scanning electron microscope (SEM), it is effective to improve resolution of energy discrimination. However, when the resolution of energy is improved, a contrast change is large accompanying with a trajectory change of signal electrons and measurement robustness decreases. The trajectory change of the signal electrons is caused by a change in observation pattern coordinates or an electric potential fluctuation of a sample due to charging. In order to obtain a stable filtering characteristic even when the sample electric potential fluctuates, it is necessary to adjust the trajectory of the signal electrons and adjust a filtering characteristic in each measurement.

PTL 1 discloses a bandpass energy filter having high energy resolution in which the filtering characteristic changes greatly and it is difficult to implement stable observation when the trajectory of the signal electrons is not compensated accompanying with the electric potential fluctuation of the sample. Although PTL 1 discloses a technique of adjusting the trajectory of the signal electrons corresponding to an expected electric potential fluctuation of the sample, PTL 1 does not disclose a matter regarding adjusting the trajectory of the signal electrons corresponding to an electric potential fluctuation of the sample which cannot be expected in advance due to a change in observation pattern coordinates or charging. The same applies to PTL 3.

Although PTL 2 discloses a technique of compensating for the electric potential fluctuation of the sample and obtaining a stable contrast by adjusting a filtering voltage of the energy filter, PTL 2 does not disclose a method for compensating for a change in the trajectory of signal electrons.

Hereinafter, a charged-particle beam device with an object to stably perform a measurement, an inspection, or the like regardless of an electric potential fluctuation of a sample or the like will be described.

Solution to Problem

In order to achieve the above object, a first aspect of the invention provides a charged-particle beam device including a detector that detects charged particles obtained by irradiating a sample with a charged-particle beam that is emitted from a charged-particle source, an energy filter that filters energy of the charged particles emitted from the sample, a deflector that deflects the charged particles emitted from the sample towards the energy filter, a storage medium that stores a deflection condition of the deflector, and a control device that adjusts a voltage applied to the energy filter. The control device generates a first image based on an output of the detector, adjusts the voltage applied to the energy filter so that the first image is brought into a predetermined state, calculates a first parameter corresponding to energy of the charged particles emitted from the sample based on the adjusted voltage applied to the energy filter, and controls the deflector based on a second parameter that is obtained by referring to the first parameter or substituting the first parameter in an arithmetic expression or a table that indicates a relationship between the first parameter stored in the storage medium and the second parameter indicating the deflection condition.

In order to achieve the above object, a second aspect of the invention provides a charged-particle beam device including a detector that detects charged particles obtained by irradiating a sample with a charged-particle beam that is emitted from a charged-particle source, an energy filter that filters energy of the charged particles emitted from the sample, an upper deflector that deflects the charged particles emitted from the sample towards the energy filter, a lower deflector that deflects the charged particles emitted from the sample towards an intersection point between a deflection fulcrum of the upper deflector and an optical axis of the charged-particle beam, and a control device that controls the upper deflector and the lower deflector. The control device adjusts a deflection condition of the upper deflector and the lower deflector corresponding to an adjustment amount of the energy filter.

In order to achieve the above object, a third aspect of the invention provides a charged-particle beam device including a detector that detects charged particles obtained by irradiating a sample with a charged-particle beam that is emitted from a charged-particle source, an energy filter that filters energy of the charged particles emitted from the sample, a first charged-particle beam deflector that deflects the charged-particle beam out of an optical axis, a second charged-particle beam deflector that deflects the charged-particle beam deflected by the first charged-particle beam deflector to be parallel to the optical axis of the charged-particle beam, an upper deflector that deflects the charged-particle beam deflected by the second charged-particle beam deflector towards the optical axis of the charged-particle beam, a lower deflector that deflects the charged-particle beam deflected by the upper deflector so that the charged-particle beam travels along the optical axis of the charged-particle beam, and a control device that controls the first charged-particle beam deflector, the second charged-particle beam deflector, the upper deflector, and the lower deflector. The control device adjusts a deflection condition of the first charged-particle beam deflector, the second charged-particle beam deflector, the upper deflector, and the lower deflector corresponding to an adjustment amount of the energy filter.

Advantageous Effect

According to the above configurations, a measurement, an inspection, or the like can be stably performed regardless of the electric potential fluctuation of the sample or the like.

BRIEF DESCRIPTION OF DRAWINGS

FIG. 1 is a diagram showing an example of a charged-particle beam device including an energy filter.

FIG. 2 is a flowchart showing steps of adjusting a filtering condition of the energy filter and adjusting a trajectory of signal electrons.

FIG. 4 is a diagram showing an example of a charged-particle beam device including a bandpass energy filter.

FIG. 5 is a diagram showing a change in signal intensity detected by a detector when a voltage applied to the bandpass energy filter is swept.

FIG. 6 is a diagram showing an example of a charged-particle beam device including a highpass energy filter.

FIG. 7 is a diagram showing a change in signal intensity detected by a detector when a voltage applied to the highpass energy filter is swept.

FIG. 8 is a diagram showing an example of a charged-particle beam device including a bandpass energy filter.

FIG. 9 is a diagram showing an example of a charged-particle beam device including a highpass energy filter.

DESCRIPTION OF EMBODIMENTS

Figure 3A:
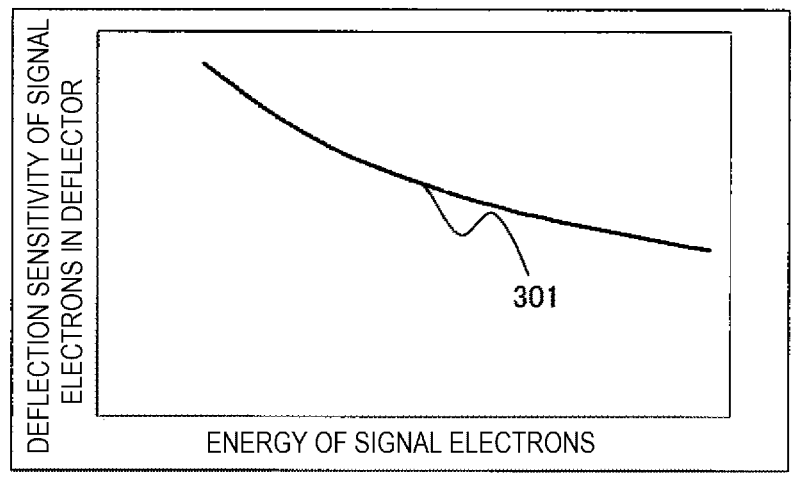
FIGS. 3A to 3C are diagrams showing a relationship between a deflection condition of a deflector and energy of the signal electrons.

In order to stably inspect and measure a semiconductor pattern, embodiments described below will describe a charged-particle beam device that adjusts a trajectory of signal electrons corresponding to an electric potential fluctuation of a sample and adjusts a filtering characteristic of an energy filter. Although a scanning electron microscope which serves as a type of the charged-particle beam device is described in the following description, the invention is not limited thereto. An adjustment as will be described below may be performed by another charged-particle beam device such as a focused ion beam (FIB).

Stable production of a semiconductor device in which miniaturization and lamination are performed requires a highly accurate inspection and measurement technique so that an SEM device is used in a manufacturing line of a semiconductor. The device inspects and measures a semiconductor pattern formed on a wafer and plays an important role in improving a yield of the manufacturing line.

Accompanying with miniaturization and a three-dimensional structure of the semiconductor pattern in recent years, a pattern is difficult to be inspected and measured with high accuracy due to a low contrast of an observation unit and a technique of increasing the contrast of the observation unit is required. Energy discrimination detection of signal electrons using a highpass energy filter that blocks signal electrons having low energy or a bandpass filter that splits energy of the signal electrons is effective in increasing a contrast of an SEM image. These energy filters improve energy resolution so that the observation unit can perform observation with a higher contrast.

On the other hand, it is also a performance target to improve reproducibility of the measurement and inspection while improving a contrast of an image especially when a pattern or the like formed on the semiconductor device is measured or inspected. For example, when the line width of patterns having the same size is measured, it is necessary for the device to output the same result. However, when degrees of charging adhesion of samples are different, a trajectory of electrons emitted from the samples changes and a trajectory of electrons entering the energy filter also changes. As a result, different measurement results are output even when sizes are the same. More specifically, when a device adjustment is performed to obtain a maximum contrast in order to simply increase the contrast, a shape of a line profile used for performing a size measurement is changed corresponding to a charging adhesion state and different measured results corresponding to the charging adhesion state are output.

Hereinafter, a charged-particle beam device capable of stably performing a measurement or an inspection (a measurement or an inspection that achieves high reproducibility) and a method for adjusting the charged-particle beam device will be described.

Embodiments described below will describe a charged-particle beam device and a method for adjusting a trajectory of signal charged particles accompanying with an electric potential fluctuation of a sample. The charged-particle beam device includes a signal charged-particle deflection unit that is disposed between, for example, a charged-particle source and the sample and deflects signal charged particles emitted from the sample, a signal charged-particle deflection control unit that controls the signal charged-particle deflection unit, a charged-particle detection unit that detects the signal charged particles, a signal charged-particle energy discrimination unit that discriminates energy of the signal charged particles detected by the charged-particle detection unit, and a signal charged-particle energy discrimination control unit that controls the signal charged-particle energy discrimination unit. The signal charged-particle deflection control unit controls the signal charged-particle deflection unit so as to adjust the trajectory of the signal charged particles corresponding to the electric potential fluctuation of the sample. A method for adjusting an energy discrimination characteristic of the signal charged-particle energy discrimination unit will also be described.

According to the above configuration, an SEM observation with high contrast can be preformed stably and a measurement and an inspection of a semiconductor pattern are implemented with high accuracy even when the electric potential fluctuation of the sample occurs. Other embodiments will be clarified from the following description of the embodiments.

Hereinafter, the charged-particle beam device that controls the trajectory of the charged particles emitted from the sample will be described with reference to the drawings. Embodiments described below are for the purpose of understanding the invention and are not used to limit the invention. Although embodiments described below are applicable to a charged-particle beam device in general, an example in which the embodiments are applicable to an SEM inspection and measurement device will be described below.

The charged-particle beam device described below is controlled by a control device including a computer processor and a non-transitory computer-readable medium. When the control is implemented by the computer processor, the non-transitory computer readable medium is encoded with a computer instruction that causes a system control roller to perform predetermined processing, and controls the charged-particle beam device according to processing steps that will be described below.

First Embodiment

FIG. 1 shows a configuration of a charged-particle beam device that implements a trajectory adjustment for signal electrons and an energy filter adjustment accompanying with an electric potential fluctuation of a sample according to a first embodiment. Signal electrons 104 such as secondary electrons (SE) and backscattered electrons (BSE) that are emitted from a sample 103 by irradiating the sample 103 with a primary electron beam 102 emitted from an electron source 101 are deflected by a lower signal electron deflector 105 and an upper signal electron deflector 106.

Here, the lower signal electron deflector 105 is controlled to cause the signal electrons 104 to pass through a signal electron deflection fulcrum 107 that is an intersection point of an optical axis (a trajectory through which an electron beam that is not deflected passes) and the height of the upper signal electron deflector 106. An operation amount of the lower signal electron deflector 105 changes corresponding to, for example, energy (acceleration voltage of electron beam–voltage applied to sample) of the primary electron beam 102 arriving at the sample and is accordingly stored in a storage medium or the like provided in a control device 113 for each settable optical condition of the device including the arriving energy.

The signal electrons 104 are deflected by the upper signal electron deflector 106 at the signal electron deflection fulcrum 107 and are detected by a signal electron detector 108. An energy filter 109 is provided on a front surface of the signal electron detector 108. Energy of the signal electrons 104 is discriminated by adjusting a voltage applied to the energy filter 109.

At this time, initial energy of the signal electrons 104 changes when electric potential of the sample 103 fluctuates and a trajectory of the signal electrons 104 changes accordingly. As a result, a filtering characteristic of the energy filter 109 changes, causing changes in a contrast of an SEM image acquired by an image acquiring unit 110.

In the present embodiment, an energy filter control unit 111 provided in the control device 113 sets a condition of the energy filter 109 so that the SEM image acquired by the image acquiring unit 110 is stable regardless of sample charging or the like, and the signal electron deflection control unit 112 adjusts an operation amount of the lower signal electron deflector 105 and the upper signal electron deflector 106 based on the condition. By doing so, the trajectory of the signal electrons 104 is compensated. That is, a first parameter calculated based on the energy filter condition (or the energy of the signal electrons calculated based on the energy filter condition) and a second parameter indicating deflection conditions (deflection sensitivity, coordinates, a speed, or a deflection signal) of the deflectors are associated with each other and are stored in a table or arithmetic expression. The table or arithmetic expression is prepared and the deflectors are controlled based on a deflection signal calculated from the table or arithmetic expression. According to such a configuration, the trajectory can be adjusted corresponding to the energy filter condition that offsets an influence of charging or the like. As a result, the signal electrons can be deflected stably regardless of a charging fluctuation. The embodiment described below describes an example in which an arithmetic expression for calculating a deflection signal amount based on an energy change amount ($\Delta E$) of signal electrons that changes corresponding to a charging amount is stored in a predetermined storage medium and a deflection amount is calculated using a processor.

FIG. 2 is a flowchart showing steps of adjusting the trajectory of the signal electrons 104 and adjusting the energy filter 109 corresponding to an electric potential fluctuation of the sample 103. First, a reference SEM image used in a measurement and an inspection is acquired and a contrast of the reference image is set as a reference contrast (step 201). The reference contrast may be determined based on, for example, extraction of a maximum luminance region and a minimum luminance region in the image, or calculated from luminance of a region of interest (ROI) and a background region. In such a case, the luminance of the ROI and the background region may be calculated from average luminance in the ROI and average luminance in the background region.

Thereafter, an evaluation image (a first image) is acquired (step 202) and a contrast of the evaluation image is compared with the reference contrast (step 203). At this time point, the evaluation image is determined as a final evaluation image (step 209) if the electric potential of the sample 103 does not fluctuate and the contrast of the evaluation image is the same with the reference contrast set in step 201 (or within a predetermined contrast range based on the reference contrast).

When the electric potential of the sample 103 fluctuates and a contrast difference occurs, a voltage of the energy filter 109 is changed (step 204) and an evaluation image having the same contrast or a closest contrast is acquired (step 205).

The contrast of the evaluation image is compared with the reference contrast (step 206). If the electric potential fluctuation causes a substantially ignorable change in the trajectory of the signal electrons 104, the contrast of the evaluation image matches with the reference contrast (or within a predetermined contrast range based on the reference contrast) and the evaluation image is accordingly determined as the final evaluation image (step 209). When the contrast of the evaluation image does not match with the reference contrast, an operation amount of the lower signal electron deflector 105 and the upper signal electron deflector 106 is determined based on a change amount of the energy filter 109 in step 204 and the trajectory of the signal electrons 104 is changed (step 207).

Thereafter, the contrast of the evaluation image is compared with the reference contrast again (S208). If the contrasts are not the same, the process returns to the voltage adjustment of the energy filter 109 and the energy filter 109, the lower signal electron deflector 105, and the upper signal electron deflector 106 are repeatedly adjusted until the contrast of the evaluation image is the same as the reference contrast defined in step 201.

The final evaluation image acquired as described above is acquired in a state in which the trajectory of the signal electrons 104 is adjusted and the filtering characteristic of the energy filter 109 is adjusted. An inspection and a measurement can be performed stably by implementing the above sequence for each measurement. A relationship between the voltage change amount of the energy filter 109 and the operation amount of the lower signal electron deflector 105 and the upper signal electron deflector 106 will be described below. The energy change amount ΔE of the signal electrons 104 that passes through the energy filter 109 and a voltage change amount ΔV of the energy filter 109 have a linear relationship of ΔE=αΔV. The proportional coefficient a is a value uniquely determined by a trajectory calculation. Therefore, the voltage of the energy filter 109 is swept, and the energy change amount ΔE of the signal electrons 104 due to the electric potential fluctuation of the sample 103 is determined based on the voltage change amount ΔV obtained from the contrast that is closest to the reference contrast.

Figure 3B:
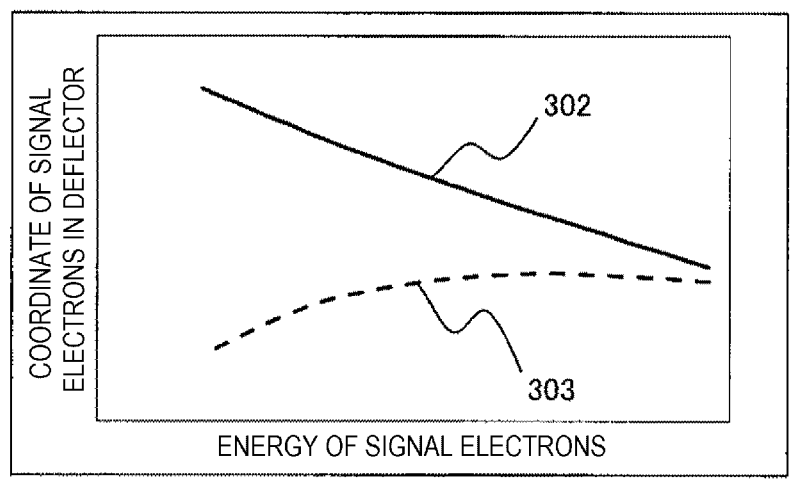
Figure 3C:
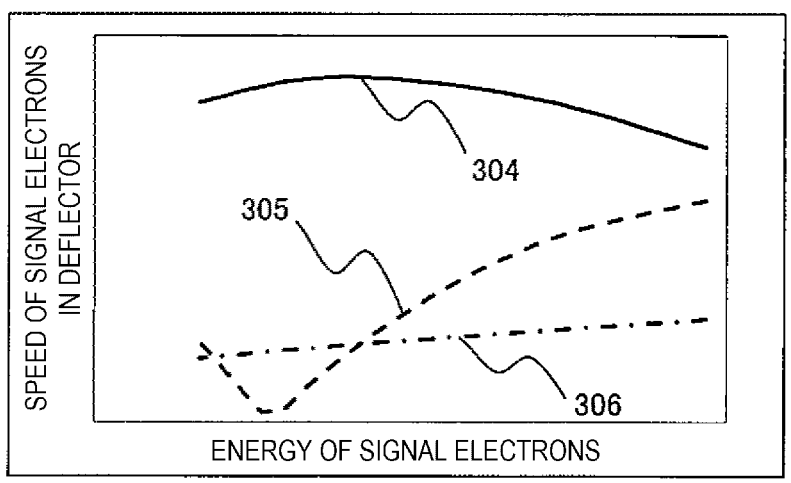

Next, FIGS. 3(A), 3(B), and 3(C) respectively show deflection sensitivity S (301), coordinates X (302) and Y (303), speeds VX (304), VY (305), and VZ (306) for energy of the signal electrons 104 in the lower signal electron deflector 105. The deflection sensitivity S (301), the coordinates X (302) and Y (303), the speeds VX (304), VY (305), and VZ (306) can be calculated in advance by a trajectory calculation.

The lower signal electron deflector 105 is operated to guide the signal electrons 104 to the signal electron deflection fulcrum 107. However, a required operation amount of the lower signal electron deflector 105 can be uniquely determined based on the relationships shown in FIGS. 3(A), 3(B), and 3(C) when the energy of the signal electrons 104 is E+ΔE due to the electric potential fluctuation of the sample 103. Specifically, a function formula as shown in FIGS. 3(A), 3(B), and 3(C) is stored in a predetermined storage medium in advance. Deflection sensitivity (A) of the signal electrons corresponding to E+ΔE (a first parameter), and signal electron coordinates (B) and signal electron speeds (C) in the deflector are calculated by substituting E+ΔE in the function formula. Calculated parameters (a second parameter) are substituted in a Formula 1 that is stored in a predetermined storage medium to calculate a deflection amount. When a voltage applied to the energy filter before adjustment is V, E can be calculated by α×V.

$$V_L = \frac{-\tan^{-1}\left(IS_x \cdot \frac{v_{Lx}}{v_{Lz}}\right) + \tan^{-1}\left(IS_y \cdot \frac{v_{Ly}}{v_{Lz}}\right) - \tan^{-1}\left(\frac{\sqrt{X_L^2 + Y_L^2} \cdot \left\{IS_x \cdot \cos\left[\tan^{-1}\left(\frac{Y_L}{X_L}\right)\right] - IS_y \cdot \sin\left[\tan^{-1}\left(\frac{Y_L}{X_L}\right)\right]\right\}}{Z}\right)}{S_L}$$ [Formula 1]

Here, $X_L$ is an x coordinate of the signal electrons in the lower deflector per unit image shift, $Y_L$ is a y coordinate of the signal electrons in the lower deflector per unit image shift, $V_{Lx}$ is a speed of the signal electrons in an x direction in the lower deflector per unit image shift, $V_{LY}$ is a speed of the signal electrons in a y direction in the lower deflector per unit image shift, $V_{LZ}$ is a speed of the signal electrons in a z direction in the lower deflector per unit image shift, $S_U$ is deflection sensitivity of the signal electrons per voltage operation amount of the upper deflector, and $S_L$ is deflection sensitivity of the signal electrons per voltage operation amount of the upper deflector. ISx is an image shift amount in the x direction, ISy is an image shift amount in the y direction, and Z is a distance between the upper deflector and the lower deflector. Coordinates and speeds are at the same height as the deflectors.

An operation amount of the upper signal electron deflector 106 may be determined based on a difference of arrival angles of the signal electrons 104 at the signal electron deflection fulcrum 107. The difference of the arrival angles is generated by a difference of an operation amount of the lower signal electron deflector 105. The operation amount of the upper signal electron deflector 106 may be calculated from a Formula 2.

$$V_U = \frac{\tan^{-1}\left(\frac{\sqrt{X_L^2 + Y_L^2} \cdot \left\{IS_x \cdot \cos\left[\tan^{-1}\left(\frac{Y_L}{X_L}\right)\right] - IS_y \cdot \sin\left[\tan^{-1}\left(\frac{Y_L}{X_L}\right)\right]\right\}}{Z}\right) + I_D}{S_U}$$ [Formula 2]

$I_D$ is an angle between the optical axis and the detectors.

The relationships of the deflection sensitivity, the coordinates, and the speed with respect to the energy of the signal electrons 104 shown in FIGS. 3(A), 3(B), and 3(C) change corresponding to an image shift amount used for adjusting a position of the sample 103 that is irradiated with the primary electron beam 10, and linearly change with respect to the image shift amount. Therefore, if values of the relationships at a certain image shift amount is calculated by the trajectory calculation, the operation amount of the lower signal electron deflector 105 and the upper signal electron deflector 106 when the image shift changes can be uniquely determined.

As described above, since the operation amount of the lower signal electron deflector 105 and the upper signal electron deflector 106 that compensates for the trajectory of the signal electrons 104 can be set based on the voltage change amount ΔV of the energy filter 109, a stable evaluation image can be acquired.

Second Embodiment

According to a second embodiment, an SEM includes an electron source, a first two-stage deflector that deflects a primary electron beam emitted from the electron source, a second two-stage deflector that changes a scanning region of the primary electron beam, a focusing lens that focuses the primary electron beam deflected by the first and the second deflectors, a third two-stage deflector that deflects signal electrons generated from a sample by scanning the sample with the focused primary electron beam, a retarding voltage application unit that applies to the sample a negative voltage that retards the primary electron beam, a spectrometer used for discriminating energy of the signal electrons, and a detector that detects the signal electrons passing through the spectrometer. An offset voltage is applied between the retarding voltage and the spectrometer and an operation amount of the third two-stage deflector is determined by the offset voltage.

FIG. 4 is a diagram showing a configuration of the SEM according to the second embodiment. The sample is one-dimensionally or two-dimensionally scanned with the primary electron beam 102 emitted from the electron source 101 by an upper deflector 401 and a lower deflector 402. An upper image shift deflector 403 and a lower image shift deflector 404 are used for moving a region that is scanned by the upper deflector 401 and the lower deflector 402 to any position of the sample. The image shift deflectors are used for moving a field of view (FOV). An objective lens 405 focuses the primary electron beam 102 and the sample is irradiated with the focused primary electron beam 102. Although the scanning electron microscope including one lens is described for easy description, other lenses other than the objective lens may be provided as necessary.

The sample 103 is placed on a sample holder 406 and is in electrical contact with the sample holder 406. A retarding voltage is applied from a retarding power source 407 to the sample holder 406. The primary electron beam 102 is retarded by a retarding electric field formed based on the retarding voltage and is emitted onto the sample 103.

The signal electrons 104 emitted from the sample 103 on a basis that the sample 103 is irradiated with the primary electron beam 102 are accelerated by the electric field formed by applying the retarding voltage to the sample holder 406 (the electric field that retards the primary electron beam 102 becomes an acceleration electric field that accelerates the signal electrons 104 emitted from the sample). Thereafter, the signal electrons 104 are deflected by the upper image shift deflector 403 and the lower image shift deflector 404 and then deflected by the lower signal electron deflector 105 and the upper signal electron deflector 106.

Here, the lower signal electron deflector 105 and the upper signal electron deflector 106 according to the second embodiment are optical elements of which an electric field and a magnetic field are orthogonal. Magnitudes of the electric field and the magnetic field are set to a Wien condition under which the primary electron beam 102 is not deflected by the lower signal electron deflector 105 and the upper signal electron deflector 106. Under the Wien condition, the signal electrons 104 that pass through the lower signal electron deflector 105 and the upper signal electron deflector 106 in a direction opposite to the primary electron beam 102 are deflected by the lower signal electron deflector 105 and the upper signal electron deflector 106.

The signal electrons 104 deflected by the lower signal electron deflector 105 pass through the signal electron deflection fulcrum 107 which is an intersection point between the height of the upper signal electron deflector 106 and the optical axis. The signal electrons 104 that arrive at the signal electron deflection fulcrum 107 are deflected by the upper signal electron deflector 106 and enter the energy filter 109. The energy filter 109 shown in FIG. 4 is a spectrometer that selectively allows the signal electrons 104 having a specific energy band to pass through. The spectrometer includes a cylindrical electrode surrounding a trajectory through which the signal electrons pass through. The cylindrical electrode includes two electrodes bent along the trajectory of the signal electrons. Energy of the signal electrons that pass through a slit provided between the detector 108 and the cylindrical electrode can be selected by adjusting an inner electrode power source 408 that applies a voltage to an electrode disposed on an inner side of the trajectory of the signal electrons and an outer electrode power source 409 that applies a voltage to an electrode disposed on an outer side of the trajectory of the signal electrons. As a result, electrons having any energy among detected signal electrons can be selectively detected.

Although an example of the spectrometer includes a sector spectrometer including two electrodes that scatter energy by electrostatic deflecting the signal electrons in the present embodiment, the invention is not limited to such a configuration. Alternatively, effects of the present embodiment can also be obtained by using, for example, a hemispherical spectrometer.

Here, a case where an electric potential fluctuation of the sample 103 caused by a change in an observation position of a pattern or charging adhesion on a surface of the sample that is irradiated with the primary electron beam 102 is considered. Since the energy of the signal electrons 104 at the time of being emitted from the sample also changes accompanying with the electric potential fluctuation of the sample 103, the trajectory of the signal electrons 104 and a filtering characteristic of the spectrometer may change and an inspection and a measurement may not be stably performed. In order to compensate for the electric potential fluctuation of the sample 103, the control device 113 adds (or subtracts) an offset voltage corresponding to charging to a voltage of the energy filter and applies the offset voltage to the energy filter. The offset voltage is set to cause contrasts of an SEM image acquired by the image acquiring unit 110 before and after the electric potential fluctuation of the sample 103 to be closest to a reference contrast of a reference image, as shown in the flowchart in FIG. 2.

By only adjusting the offset voltage, the trajectory of the signal electrons 104 is not compensated and the filtering characteristic of the spectrometer changes, and accordingly images having the same contrast cannot be acquired. Therefore, a signal electron deflection control unit 112 sets the operation amount of the lower signal electron deflector 105 and the upper signal electron deflector 106 based on an amount of the offset voltage used when the contrasts of the image acquired by the image acquiring unit 110 before and after the electric potential fluctuation of the sample 103 are closest to the reference contrast. A method for determining the operation amount of the lower signal electron deflector 105 and the upper signal electron deflector 106 is as described above.

As described above, since the signal electrons 104 can arrive at the spectrometer along the same trajectory before and after the electric potential fluctuation of the sample 103 and the filtering characteristic of the spectrometer can also be maintained at the same level, an inspection and a measurement can be performed stably.

FIG. 5 shows a change in signal intensity of the signal electrons 104 detected by the detector 108 when the offset voltage applied to the spectrometer is swept. Since the energy filter is a bandpass energy filter, the signal intensity with respect to the offset voltage changes as shown by a waveform 501. Here, the reference image is acquired under a condition that, for example, the signal intensity at an observation position is 502. The energy filter control unit 111 sets an offset voltage condition of the spectrometer so that signal intensity is the same as the signal intensity of the reference image. Under such a condition, the signal electron deflection control unit 112 sets the operation amount of the lower signal electron deflector 105 and the upper signal electron deflector 106.

By performing the control described above in the configuration as shown in FIG. 4, a measurement and an inspection can be performed stably regardless the electric potential fluctuation of the sample or the like even in the scanning electron microscope including the bandpass filter.

Third Embodiment

FIG. 6 is a diagram showing a configuration example of a scanning electron microscope according to a third embodiment. The present embodiment describes an example in which a highpass energy filter is adopted instead of the energy filter which is a spectrometer described in the second embodiment. The spectrometer shown in FIG. 4 is a bandpass filter which scatters energy of the signal electrons by bending the trajectory of the signal electrons using an electric field, a magnetic field, or both the electric field and the magnetic field and prevents, by the slit, signal electrons having lower energy than signal electrons in a specific trajectory range and signal electrons having higher energy than the signal electrons in the specific trajectory range from arriving at the detector, so as to selectively allow the signal electrons in the specific trajectory range to pass through. On the other hand, the energy filter 109 shown in FIG. 6 is a highpass filter which, by adjusting a voltage (a negative voltage in a case of a device that detects electrons) that is applied to a mesh-like electrode, prevents signal electrons having lower energy than the applied voltage from arriving at the detector and allows signal electrons having higher energy than the applied voltage to arrive at the detector.

An image acquisition sequence in the present embodiment is the same as the image acquisition sequence in the second embodiment. Since the energy filter adopted in the present embodiment is a highpass filter, an intensity change of the signal electrons 104 at the time of sweeping a cutoff voltage of the energy filter 109 is shown by a waveform (a waveform 701) obtained by integrating signal waveforms indicating signal intensity distributions of the bandpass filter as shown in FIG. 7.

Similar to the second embodiment, a reference image is acquired under a condition that, for example, the signal intensity at an observation position is 702 in the present embodiment. The energy filter control unit 111 sets the cutoff voltage of the highpass energy filter 109 so that signal intensity is the same as the signal intensity of the reference image. Under the condition, the signal electron deflection control unit 112 sets the operation amount of the lower signal electron deflector 105 and the upper signal electron deflector 106.

Fourth Embodiment

A scanning electron microscope including a spectrometer serving as an energy filter as shown in FIG. 8 will be described in the present embodiment. A configuration shown in FIG. 8 is different from the configuration including the same spectrometer as shown in FIG. 4 in that a deflector used for deflecting signal electrons out of an optical axis adopts a magnetic field deflector in the configuration shown in FIG. 8 as compared with an orthogonal electromagnetic field generator in the configuration shown in FIG. 4, in which the electric field and the magnetic field are orthogonal. Unlike a Wien filter, a magnetic field alone cannot satisfy a Wien condition. Therefore, when the signal electrons 104 are deflected, the primary electron beam 102 is also deflected.

In order to make the primary electron beam 102 emitted perpendicularly onto the surface of the sample 103 in the present embodiment, an upper primary electron beam deflector 801 and a lower primary electron beam deflector 802 are provided. The primary electron beam is deflected by a total of four deflectors to arrive at the sample 103. More specifically, the upper primary electron beam deflector 801 (a first charged-particle beam deflector) is used to form a magnetic field perpendicular to a paper surface so that the primary electron beam 102 is deflected out of the optical axis (the trajectory through which the beam passes when the beam is not deflected). Then, the lower primary electron beam deflector 802 (a second charged-particle beam deflector) is used to form a magnetic field that is in an direction opposite to the magnetic field formed by the upper primary electron beam deflector 801 so that the primary electron beam 102 is deflected back to a direction parallel to the optical axis.

The primary electron beam 102 deflected by the lower primary electron beam deflector 802 passes out of the optical axis and is deflected towards the optical axis by the upper signal electron deflector 106 that generates a magnetic field perpendicular to the paper surface. Further, the lower signal electron deflector 105 deflects the primary electron beam 102 back so that the primary electron beam 102 passes through the optical axis. Thus, deflections on the primary electron beam 102 by the signal electron deflectors are offset such that the signal electrons can be selectively deflected out of the optical axis by the signal electron deflectors by deflecting the primary electron beam 102 out of the optical axis.

In order to compensate for the trajectory of the signal electrons 104 that is changed due to the electric potential fluctuation of the sample 103 in such a device, as shown in FIG. 8, the trajectory of the signal electrons 104 is compensated by changing the trajectory of the primary electron beam 102 to a trajectory 803 by the upper primary electron beam deflector 801, the lower primary electron beam deflector 802, the lower signal electron deflector 105, and the upper signal electron deflector 106, and changing the trajectory of the signal electrons 104 to a trajectory 804.

Fifth Embodiment

A fifth embodiment will be described with reference to FIG. 9. The present embodiment is different from the fourth embodiment in that a spectrometer of the energy filter 109 is a highpass energy filter.

Similar to the fourth embodiment, in order to compensate for the trajectory of the signal electrons 104 that is changed due to the electric potential fluctuation of the sample 103, as shown in FIG. 9, the trajectory of the signal electrons 104 can also be compensated in the present embodiment by changing the trajectory of the primary electron beam 102 to the trajectory 803 by the upper primary electron beam deflector 801, the lower primary electron beam deflector 802, the lower signal electron deflector 105, and the upper signal electron deflector 106, and changing the trajectory of the signal electrons 104 to the trajectory 804.

REFERENCE SIGN LIST

101 . . . electron source
102 . . . primary electron beam
103 . . . sample
104 . . . signal electron
105 . . . lower signal electron deflector
106 . . . upper signal electron deflector
107 . . . signal electron deflection fulcrum
108 . . . detector
109 . . . energy filter device
110 . . . image acquiring unit
111 . . . energy filter control unit
112 . . . signal electron deflection control unit
113 . . . control device
301 . . . waveform indicating signal electron energy dependence of deflection sensitivity of signal electrons in signal electron deflector
302 . . . waveform indicating signal electron energy dependence of signal electrons at X coordinate in signal electron deflector
303 . . . waveform indicating signal electron energy dependence of signal electrons at Y coordinate in signal electron deflector 304 . . . waveform indicating signal electron energy dependence of speed of signal electrons in X direction in signal electron deflector
305 . . . waveform indicating signal electron energy dependence of speed of signal electrons in Y direction in signal electron deflector
306 . . . waveform indicating signal electron energy dependence of speed of signal electrons in Z direction in signal electron deflector
401 . . . upper deflector
402 . . . lower deflector
403 . . . upper image shift deflector
404 . . . lower image shift deflector
405 . . . objective lens
406 . . . sample holder
407 . . . retarding power source
408 . . . inner electrode power source
409 . . . outer electrode power source
801 . . . upper primary electron beam deflector
802 . . . lower primary electron beam deflector
803 . . . deflected primary electron beam
804 . . . deflected signal electron

The invention claimed is:

1. A charged-particle beam device comprising:
a detector that detects charged particles obtained by irradiating a sample with a charged- particle beam that is emitted from a charged-particle source;
an energy filter that filters energy of charged particles emitted from the sample;
a deflector that deflects the charged particles emitted from the sample towards the energy filter;
a storage medium that stores a deflection condition of the deflector; and
a control device that adjusts a voltage applied to the energy filter, wherein
the control device
generates a first image based on an output of the detector,
adjusts the voltage applied to the energy filter so that the first image is brought into a predetermined state,
calculates a first parameter that changes corresponding to energy of the charged particles emitted from the sample based on the adjusted voltage applied to the energy filter, and
controls the deflector based on a second parameter that is obtained by referring to the first parameter or substituting the first parameter in an arithmetic expression or a table that indicates a relationship between the first parameter stored in the storage medium and the second parameter indicating the deflection condition, wherein
a reference image is stored in the storage medium, and
the control device controls the voltage applied to the energy filter so that a contrast of the first image matches with a contrast of the reference image, or that the contrast of the first image falls within a predetermined range based on the contrast of the reference image.

2. A charged-particle beam device comprising:
a detector that detects charged particles obtained by irradiating a sample with a charged- particle beam that is emitted from a charged-particle source;
an energy filter that filters energy of charged particles emitted from the sample;
a deflector that deflects the charged particles emitted from the sample towards the energy filter;
a storage medium that stores a deflection condition of the deflector; and
a control device that adjusts a voltage applied to the energy filter, wherein
the control device
generates a first image based on an output of the detector,
adjusts the voltage applied to the energy filter so that the first image is brought into a predetermined state,
calculates a first parameter that changes corresponding to energy of the charged particles emitted from the sample based on the adjusted voltage applied to the energy filter, and
controls the deflector based on a second parameter that is obtained by referring to the first parameter or substituting the first parameter in an arithmetic expression or a table that indicates a relationship between the first parameter stored in the storage medium and the second parameter indicating the deflection condition, wherein
a reference image is stored in the storage medium,
the control device controls the voltage applied to the energy filter so that a contrast of the first image matches with a contrast of the reference image, or that the contrast of the first image falls within a predetermined range based on the contrast of the reference image, and
the control device controls the deflector using the first parameter when the contrast of the first image does not match with the contrast of the reference image or when the contrast of the first image does not fall within the predetermined contrast range based on the contrast of the reference image after the energy filter is adjusted.

3. A charged-particle beam device comprising:
a detector that detects charged particles obtained by irradiating a sample with a charged-particle beam that is emitted from a charged-particle source;
an energy filter that filters energy of charged particles emitted from the sample;
an upper deflector that deflects the charged particles emitted from the sample towards the energy filter;
a lower deflector that deflects the charged particles emitted from the sample towards an intersection point of a deflection fulcrum of the upper deflector and an optical axis of the charged-particle beam; and
a control device that controls the upper deflector and the lower deflector, wherein:
the upper and lower deflectors are arranged on the optical axis of the charged-particle beam; and
the control device adjusts a deflection condition of the upper deflector and the lower deflector corresponding to an adjustment amount of the energy filter.

4. The charged-particle beam device according to claim 3, wherein
the energy filter is a bandpass filter.

5. The charged-particle beam device according to claim 3, wherein
the energy filter is a highpass filter.

6. The charged-particle beam device according to claim 3, further comprising:
a storage medium that stores the deflection condition, wherein
the control device
generates a first image based on an output of the detector,
adjusts the energy filter so that the first image is brought into a predetermined state,
calculates a first parameter that changes corresponding to energy of the charged particles emitted from the sample based on a filtering condition of the energy filter after the adjustment, and controls the upper deflector and the lower deflector based on a second parameter that is obtained by referring to the first parameter or substituting the first parameter in an arithmetic expression or a table that indicates a relationship between the first parameter stored in the storage medium and the second parameter indicating the deflection condition.

7. The charged-particle beam device according to claim 6, wherein
the first parameter indicates the energy of the charged particles emitted from the sample.

8. The charged-particle beam device according to claim 6, wherein
the second parameter is at least one of deflection sensitivities of the upper and lower deflectors, signal electron coordinates in the upper and lower deflectors, and signal electron speeds in the upper and lower deflectors.

9. The charged-particle beam device according to claim 3, wherein
the upper deflector and the lower deflector are orthogonal electromagnetic field generators.

10. A charged-particle beam device comprising:
a detector that detects charged particles obtained by irradiating a sample with a charged- particle beam that is emitted from a charged-particle source;
an energy filter that filters energy of charged particles emitted from the sample;
a first charged-particle beam deflector that deflects the charged-particle beam out of an optical axis;
a second charged-particle beam deflector that deflects the charged-particle beam deflected by the first charged-particle beam deflector to be parallel to the optical axis of the charged-particle beam;
an upper deflector that deflects the charged-particle beam deflected by the second charged-particle beam deflector towards the optical axis of the charged-particle beam;
a lower deflector that deflects the charged-particle beam deflected by the upper deflector so that the charged-particle beam travels along the optical axis of the charged-particle beam; and
a control device that controls the first charged-particle beam deflector, the second charged-particle beam deflector, the upper deflector, and the lower deflector, wherein
the control device adjusts a deflection condition of the first charged-particle beam deflector, the second charged-particle beam deflector, the upper deflector, and the lower deflector corresponding to an adjustment amount of the energy filter.

11. The charged-particle beam device according to claim 10, further comprising:
a storage medium that stores the deflection condition of the deflectors, wherein
the control device
generates a first image based on an output of the detector,
adjusts the energy filter so that the first image is brought into a predetermined state,
calculates a first parameter that changes corresponding to energy of the charged particles emitted from the sample based on a filtering condition of the energy filter after the adjustment, and
controls the first charged-particle beam deflector, the second charged-particle beam deflector, the upper deflector, and the lower deflector based on a second parameter that is obtained by referring to the first parameter or substituting the first parameter in an arithmetic expression or a table that indicates a relationship between the first parameter stored in the storage medium and the second parameter indicating the deflection condition.

12. The charged-particle beam device according to claim 6, wherein
the second parameter includes at least two of deflection sensitivities of the upper and lower deflectors, signal electron coordinates in the upper and lower deflectors, and signal electron speeds in the upper and lower deflectors.

13. The charged-particle beam device according to claim 6, wherein
the second parameter includes deflection sensitivities of the upper and lower deflectors, signal electron coordinates in the upper and lower deflectors, and signal electron speeds in the upper and lower deflectors.

14. The charged-particle beam device according to claim 6, wherein
the second parameter includes deflection sensitivities of the upper and lower deflectors, signal electron coordinates in the upper and lower deflectors, signal electron speeds in the upper and lower deflectors, and a distance between the upper and lower deflectors.

15. The charged-particle beam device according to claim 6, wherein
the second parameter includes deflection sensitivities of the upper and lower deflectors, signal electron coordinates in the upper and lower deflectors, and signal electron speeds in the upper and lower deflectors, and a distance between the upper and lower deflectors and an image shift amount.

* * * * *